(12) United States Patent
Yong

(10) Patent No.: US 10,777,646 B2
(45) Date of Patent: Sep. 15, 2020

(54) THIN FILM TRANSISTOR AND DISPLAY DEVICE

(71) Applicant: Shenzhen China Star Optoelectronics Technology Co., Ltd., Shenzhen (CN)

(72) Inventor: Weina Yong, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/500,121

(22) PCT Filed: Jan. 18, 2017

(86) PCT No.: PCT/CN2017/071598
§ 371 (c)(1),
(2) Date: Feb. 28, 2019

(87) PCT Pub. No.: WO2018/000810
PCT Pub. Date: Jan. 4, 2018

(65) Prior Publication Data
US 2019/0189759 A1 Jun. 20, 2019

(30) Foreign Application Priority Data
Jul. 1, 2016 (CN) .......................... 2016 1 0510471

(51) Int. Cl.
*G02F 1/136* (2006.01)
*H01L 29/417* (2006.01)
(Continued)

(52) U.S. Cl.
CPC ...... *H01L 29/41733* (2013.01); *G02F 1/1368* (2013.01); *H01L 29/08* (2013.01);
(Continued)

(58) Field of Classification Search
CPC . G02F 1/1368; H01L 29/41733; H01L 29/08; H01L 29/78619; H01L 29/76896
See application file for complete search history.

(56) References Cited

U.S. PATENT DOCUMENTS

| 2009/0101913 A1* | 4/2009 | Shih | H01L 29/41733 257/72 |
| 2009/0268118 A1* | 10/2009 | Chang | G09G 3/3648 349/48 |
| 2015/0009446 A1* | 1/2015 | Jiang | G02F 1/136213 349/48 |

FOREIGN PATENT DOCUMENTS

| CN | 1470076 A | 1/2004 |
| CN | 101320181 A | 12/2008 |

(Continued)

OTHER PUBLICATIONS

Office Action for Chinese Patent Application Serial No. 201610510471.6, dated May 29, 2018.

(Continued)

*Primary Examiner* — James A Dudek

(57) ABSTRACT

Disclosed are a thin film transistor and a display device, which can reduce parasitic capacitance between the first metal layer and the second metal layer so as to improve display quality of a liquid crystal display device. The thin film transistor includes a gate electrode, a gate insulation layer covering the gate electrode, a semiconductor layer formed on the gate insulation layer, and a source electrode and a drain electrode formed on the semiconductor layer. The semiconductor layer has an extension portion, a plane projection of which goes beyond a range of the gate electrode, and the drain electrode covers the extension portion.

19 Claims, 2 Drawing Sheets

(51) Int. Cl.
*H01L 29/08* (2006.01)
*H01L 29/786* (2006.01)
*G02F 1/1368* (2006.01)

(52) U.S. Cl.
CPC .. *H01L 29/41775* (2013.01); *H01L 29/78618* (2013.01); *H01L 29/78696* (2013.01); *G02F 2001/13606* (2013.01)

(56) References Cited

FOREIGN PATENT DOCUMENTS

| CN | 101339923 A | 1/2009 |
| CN | 102402090 A | 4/2012 |
| CN | 105895706 A | 8/2016 |
| JP | 2000-196098 A | 7/2000 |

OTHER PUBLICATIONS

International Search Report for PCT/CN2017/071598, dated Apr. 25, 2017.
Chinese Office Action and Search Report for Chinese Patent Application No. 201610510471.6. dated Sep. 10, 2018.

* cited by examiner

THIN FILM TRANSISTOR AND DISPLAY DEVICE

CROSS-REFERENCE TO RELATED APPLICATIONS

This application claims the priority of Chinese patent application CN 201610510471.6, entitled "Thin film transistor and display device" and filed on Jul. 1, 2016, the entirety of which is incorporated herein by reference.

FIELD OF THE INVENTION

The present disclosure relates to the technical field of display, and in particular, to a thin film transistor and a display device.

BACKGROUND OF THE INVENTION

With the development of the display technology, thin film transistor liquid crystal display (TFT-LCD) devices have become the most common display devices. As one of main types of flat display devices at present, the TFT-LCD devices have become important display devices of modern IT and video products.

Thin film transistors play a very important role in the active matrix display technology. Specifically, in an active matrix liquid crystal display device, each sub-pixel is provided with a thin film transistor, so that each sub-pixel may operate independently and be less susceptible by other sub-pixels. As shown in FIGS. 1 and 2, most existing thin film transistors have a bottom-gate structure, which comprises a gate electrode 11, a gate insulation layer 12, a semiconductor layer 13, and a source electrode 14 and a drain electrode 15 arranged sequentially from bottom to top, and the source electrode 14 and the drain electrode 15 are arranged in a same layer. The gate electrode 11 is connected to a scanning line 110, and the source electrode 14 is connected to a data line 140. In the thin film transistor having the above structure, a second metal layer (i.e., a layer where the source electrode 14 and the drain electrode 15 are arranged) covers the semiconductor layer.

In actual design, the source electrode 14 and the drain electrode 15 are relatively narrow in width. In addition, in order to reduce a risk of disconnection in an etching process, a line-width of a climbing portion of the drain electrode 15 (i.e., a portion which covers an edge of the semiconductor 13) is generally increased locally. In this way, an overlapping area of the second metal layer and a first metal layer (i.e., a layer where the gate electrode 11 is provided) is increased, and therefore parasitic capacitance between the first metal layer and the second metal layer is increased. Increased parasitic capacitance results in the greater capacitance coupling effect and the signal delay effect, which affects the display effect of the liquid crystal display device and reduces the display quality thereof.

SUMMARY OF THE INVENTION

The present disclosure aims to provide a thin film transistor and a display device so as to reduce parasitic capacitance between a first metal layer and a second metal layer and improve display quality of a liquid crystal display device.

The present disclosure provides a thin film transistor, which comprises a gate electrode, a gate insulation layer covering the gate electrode, a semiconductor layer formed on the gate insulation layer, and a source electrode and a drain electrode formed on the semiconductor layer. The semiconductor layer has an extension portion, a plane projection of which goes beyond a range of the gate electrode, and the drain electrode covers the extension portion of the semiconductor layer.

Preferably, the drain electrode is in a line form.

Further, the drain electrode comprises a climbing portion and a flat portion, and the climbing portion covers the extension portion of the semiconductor layer.

Furthermore, a width of the climbing portion is larger than that of the flat portion.

Preferably, the source electrode is in a U-shaped form.

Further, the source electrode comprises an arc portion and two linear portions, and the two linear portions are connected to two ends of the arc portion respectively.

Furthermore, the drain electrode is arranged between the two linear portions of the source electrode.

The present disclosure further provides a display device. The display device comprises an array substrate, a color filter substrate, and a liquid crystal layer filled between the array substrate and the color filter substrate. The array substrate comprises a plurality of thin film transistors disclosed in the above.

Preferably, the display device is a mobile phone or a tablet computer.

Preferably, a PPI value of the display device is above 400.

The present disclosure brings the following beneficial effects. According to the thin film transistor provided by the present disclosure, an improvement is made to a shape of the semiconductor layer, i.e., an extension portion is added to the semiconductor layer. The plane projection of the extension portion goes beyond the range of the gate electrode, and the drain electrode covers the extension portion. Since the plane projection of the extension portion of the semiconductor layer is outside the gate electrode, overlapping between the climbing portion of the drain electrode and the gate electrode can be avoided. A portion of the drain electrode, a line width of which is increased for preventing disconnection, does not overlap the gate electrode either, and therefore the parasitic capacitance between the first metal layer and the second metal layer can be reduced. Hence, capacitance coupling effect and signal delay effect are weakened, and the display quality of the liquid crystal display device is improved.

Other advantages, objectives, and features of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

In order to explain the technical solutions of the embodiments of the present disclosure more clearly, a brief introduction is made to the accompanying drawings needed in descriptions of the embodiments. In the drawings.

DETAILED DESCRIPTION OF THE EMBODIMENTS

The present disclosure will be explained in detail with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no structural conflict, all the technical features mentioned in all the embodiments may be combined together in any manner, and the technical solutions obtained in this manner all fall within the scope of the present disclosure.

Embodiment 1

Figure 1:
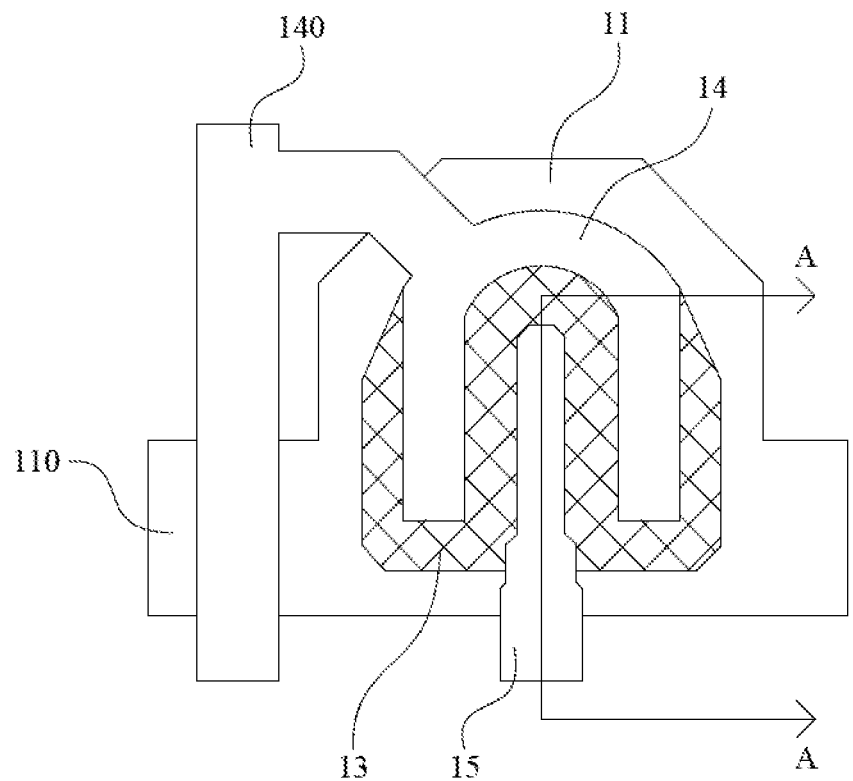
FIG. 1 schematically shows a plan view of a thin film transistor in the prior art.
Figure 2:
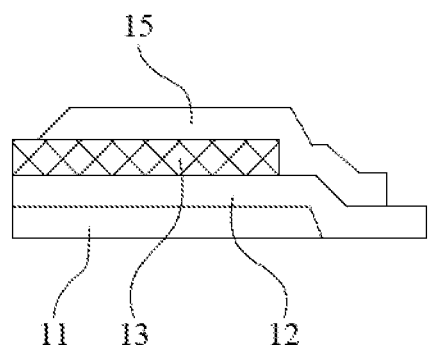
FIG. 2 schematically shows a cross-section view of FIG. 1 along an A-A line.
Figure 3:
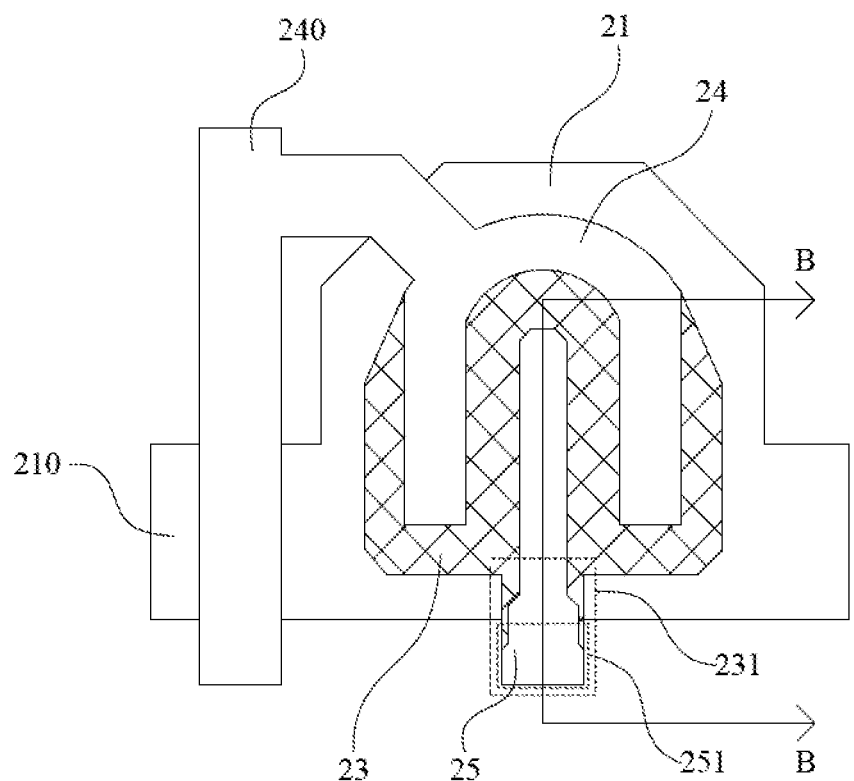
FIG. 3 schematically shows a plan view of a thin film transistor provided in embodiments of the present disclosure.
Figure 4:
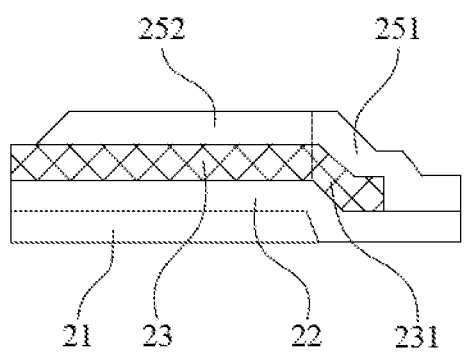
FIG. 4 schematically shows a cross-section view of FIG. 3 along a B-B line.

The present embodiment provides a thin film transistor, which can be applied in a liquid crystal display device. As shown in FIGS. 3 and 4, an amorphous silicon (a-Si) thin film transistor is taken as an example for illustrating the present embodiment. The thin film transistor comprises a gate electrode 21, a gate insulation layer 22 covering the gate electrode 21, a semiconductor layer 23 formed on the gate insulation layer 22, and a source electrode 24 and a drain electrode 25 formed on the semiconductor layer 23, which are arranged sequentially from bottom to top. The gate electrode 21 is connected to a scanning line 210, and the source electrode 24 is connected to a data line 240. The gate electrode 21 and the scanning line 210 are arranged in a first metal layer, and the source electrode 24, the drain electrode 25 and the data line 240 are arranged in a second metal layer. The semiconductor layer 23 has an extension portion 231. A plane projection of the extension portion 231 goes beyond an edge of the gate 21, and the drain electrode 25 covers the extension portion 231.

As shown in FIGS. 3 and 4, the drain electrode 25 of the present embodiment is in a line form, and the source electrode 24 is in a U-shaped form. The source electrode 24 comprises an arc portion and two linear portions. The two linear portions are parallel to each other, and are respectively connected to two ends of the arc portions. The drain electrode 25 is arranged between the two linear portions of the source electrode 24, and is also parallel to the two linear portions of the source electrode 24. A channel area in the thin film transistor can be increased by using the source electrode 24 with the U-shaped form, so that the thin film transistor can have a faster response speed.

In the present embodiment, the drain electrode 25 comprises a climbing portion 251 and a flat portion 252. The climbing portion 251 covers the extension portion 231 of the semiconductor layer 23, and a remaining portion of the drain electrode 25 is the flat portion 252. In order to reduce a risk of disconnection in an etching process, a width of the climbing portion 251 of the drain electrode 25 is larger than a width of the flat portion 252 thereof.

In the thin film transistor provided by the present embodiment, an improvement is made to the shape of the semiconductor layer 23, i.e., the extension portion 231 is added to the semiconductor layer 23. The plane projection of the extension portion 231 goes beyond the edge of the gate 21, and the climbing portion 251 of the drain electrode 25 covers the extension portion 231 of the semiconductor layer 23. Since the plane projection of the extension portion 231 of the semiconductor layer 23 is outside the gate electrode 21, overlapping between the climbing portion 251 of the drain electrode 25 and the gate electrode 21 can be avoided. In order to prevent disconnection, a line width of the climbing portion 251 of the drain electrode 25 can be increased. Since the gate electrode 21 does not overlap the climbing portion 251 of the drain electrode 25, parasitic capacitance between the first metal layer and the second metal layer can be reduced. Hence, capacitance coupling effect and signal delay effect are weakened, and the display quality of the liquid crystal display device is improved.

The capacitance coupling effect may be: for a single sub-pixel, in the actual working process of the thin film transistor, a high electric potential is applied to the gate electrode 21 to enable electrons to accumulate in the conductive channel, such that the thin film transistor is in a turn-on state. At this time, a voltage is applied to a pixel electrode by the data line 240 via the source electrode 24 and the drain electrode 25. Then, an electric potential at the gate electrode 21 changes from positive to negative, and the thin film transistor enters into a turn-off state. In a circumstance that electric leakage is not considered, the pixel electrode of the thin film transistor keeps the previously applied voltage until the gate electrode 21 is tuned on next time. However, in a circumstance that an overlapping area of the gate electrode 21 and the drain electrode 25 increases, i.e., the coupling capacitance increases, when the voltage at the gate electrode 21 is cut off abruptly, the voltage at the drain electrode 25 also reduces abruptly. As a result, an actual voltage at the pixel electrode is smaller than the applied voltage, which causes an undesirable display effect.

On another aspect, the signal delay effect may be: for the whole sub-pixel array, in the working process of the liquid crystal display device, voltages of a plurality of wires need to be switched continuously. For example, the scanning line 210 is turned on or turned off, and an electric potential at the data line 240 is switched between positive potentials and negative potentials. Therefore, both the scanning line 210 and the data line 240 transmit square wave voltages. When resistance and capacitance in each sub-pixel are considered, waveforms of ideal square waves input to the scanning line 210 and the data line 240 deform to a certain degree after the ideal square waves are transmitted through a number of sub-pixels. When deformation of the waveforms of the ideal square waves is aggravated, undesirable display effects, such as non-uniform luminance and chrominance or even abnormal display, are caused.

The parasitic capacitance of the thin film transistor provided by the present embodiment and parasitic capacitance of a thin film transistor in the prior art are simulated by means of a simulation software. The comparison result is shown in the following table:

| TFT structure | The prior art | The present embodiment |
| --- | --- | --- |
| Parasitic capacitance magnitude | 0.034374 pF | 0.032121 pF |
| Parasitic capacitance proportion | 100.0% | 93.4% |

It can be seen that the magnitude of the parasitic capacitance of the thin film transistor in the prior art is 0.034374 pF, and the magnitude of the parasitic capacitance of the thin film transistor provided by the present embodiment is 0.032121 pF. The magnitude of the parasitic capacitance of the thin film transistor provided by the present embodiment is only 93.4% of that in the prior art.

Therefore, in the thin film transistor provided by the present embodiment, since the climbing portion 251 having a relatively wide line width in the drain electrode 21 does not overlap the gate electrode 21, the parasitic capacitance between the first metal layer and the second metal layer can be reduced. Hence, the capacitance coupling effect and the signal delay effect in a display process are weakened, and the display quality of the liquid crystal display device is improved.

Embodiment 2

The present embodiment provides a display device. The display device is preferably a high PPI (pixels per inch) display device such as a mobile phone or a tablet computer, i.e., a display device with a high number of pixels per inch. A PPI value of the display device in the present embodiment is above 400.

The display device provided by the present embodiment comprises an array substrate, a color filter substrate, and a liquid crystal layer filled between the array substrate and the color filter substrate. The array substrate is provided with sub-pixels arranged in array thereon, and each sub-pixel is provided with a thin film transistor provided by Embodiment 1.

The display device provided by the present embodiment have the same technical features as the thin film transistor provided by Embodiment 1. Therefore, same technical problems can be solved, and same technical effects can be achieved.

In addition, the technical solution provided by the present embodiment is especially suitable for a display device with a high PPI. In a display device with a higher PPI, charge efficiency of a thin film transistor can be better improved, i.e. a signal delay can be better improved.

The above embodiments are described only for better understanding, rather than restricting the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. A thin film transistor, comprising:
   a gate electrode;
   a gate insulation layer covering the gate electrode;
   a semiconductor layer formed on the gate insulation layer; and
   a source electrode and a drain electrode formed on the semiconductor layer, wherein the semiconductor layer has an extension portion, a plane projection of which goes beyond a range of the gate electrode, and the drain electrode covers the extension portion of the semiconductor layer
   wherein the drain electrode comprises a climbing portion and a flat portion, and the climbing portion covers the extension portion of the semiconductor layer;
   the climbing portion comprises a connecting region, a first step and a second step sequentially connected with each other along a direction away from the flat portion, the connecting region is connected with the flat portion, a width of the connecting region is equal to that of the flat portion, a width of the first step is larger than that of the connecting region, a width of the second step is larger than that of the first step.

2. The thin film transistor according to claim 1, wherein the drain electrode is in a line form.

3. The thin film transistor according to claim 2, wherein the source electrode is in a U-shaped form.

4. The thin film transistor according to claim 3, wherein the source electrode comprises an arc portion and two linear portions, and the two linear portions are connected to two ends of the arc portion respectively.

5. The thin film transistor according to claim 4, wherein the drain electrode is arranged between the two linear portions of the source electrode.

6. A display device, comprising an array substrate, a color filter substrate, and a liquid crystal layer filled between the array substrate and the color filter substrate,
   wherein the array substrate comprises a plurality of thin film transistors formed thereon;
   wherein each of the thin film transistors comprises:
   a gate electrode;
   a gate insulation layer covering the gate electrode;
   a semiconductor layer formed on the gate insulation layer; and
   a source electrode and a drain electrode formed on the semiconductor layer, wherein the semiconductor layer has an extension portion, a plane projection of which goes beyond a range of the gate electrode, and the drain electrode covers the extension portion of the semiconductor layer;
   wherein the drain electrode comprises a climbing portion and a flat portion, and the climbing portion covers the extension portion of the semiconductor layer;
   the climbing portion comprises a connecting region, a first step and a second step sequentially connected with each other along a direction away from the flat portion, the connecting region is connected with the flat portion, a width of the connecting region is equal to that of the flat portion, a width of the first step is larger than that of the connecting region, a width of the second step is larger than that of the first step.

7. The display device according to claim 6, wherein the drain electrode is in a line form.

8. The display device according to claim 7, wherein the source electrode is in a U-shaped form.

9. The display device according to claim 8, wherein the source electrode comprises an arc portion and two linear portions, and the two linear portions are connected to two ends of the arc portion respectively.

10. The display device according to claim 9, wherein the drain electrode is arranged between the two linear portions of the source electrode.

11. The display device according to claim 6, wherein the display device is a mobile phone or a tablet computer.

12. The display device according to claim 7, wherein the display device is a mobile phone or a tablet computer.

13. The display device according to claim 6, wherein the display device is a mobile phone or a tablet computer.

14. The display device according to claim 8, wherein the display device is a mobile phone or a tablet computer.

15. The display device according to claim 11, wherein a PPI value of the display device is above 400.

16. The thin film transistor according to claim 1, wherein the climbing portion is symmetrically arranged.

17. The thin film transistor according to claim 1, wherein a plane projection of an end of the first step close to the connecting region is overlapped with a scanning line;
   a first side of the connecting region and the first step close to the gate electrode is contacted with the semiconductor layer, a second side of the second step close to the gate electrode is contacted with the gate insulation layer.

18. The display device according to claim 6, wherein the climbing portion is symmetrically arranged.

19. The display device according to claim 6, wherein a plane projection of an end of the first step close to the connecting region is overlapped with a scanning line;
   a first side of the connecting region and the first step close to the gate electrode is contacted with the semiconductor layer, a second side of the second step close to the gate electrode is contacted with the gate insulation layer.

* * * * *